(12) United States Patent
Apelgren et al.

(10) Patent No.: US 8,003,306 B2
(45) Date of Patent: Aug. 23, 2011

(54) METHODS OF FORMING ELECTRONIC DEVICES BY ION IMPLANTING

(75) Inventors: Eric Apelgren, Austin, TX (US); Nabil R. Yazdani, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 679 days.

(21) Appl. No.: 11/958,223

(22) Filed: Dec. 17, 2007

(65) Prior Publication Data

US 2009/0155726 A1 Jun. 18, 2009

(51) Int. Cl.
*G03F 7/26* (2006.01)
(52) U.S. Cl. ........................................ 430/315; 430/311
(58) Field of Classification Search .................. 430/311, 430/315
See application file for complete search history.

(56) References Cited

U.S. PATENT DOCUMENTS 4,231,811 A 11/1980 Somekh et al.
2006/0210886 A1* 9/2006 Mizuyama et al. ............... 430/5

OTHER PUBLICATIONS

Fu, Yiming et al., "Implant Layers: Leading-edge Noncritical Lithography," http://solidstate.articles. printthis.clickability.com/pt/cpt?action=Implant+layers . . . , Microlithography World, Nov. 2002, 7 pgs.

\* cited by examiner

*Primary Examiner* — Kathleen Duda

(57) ABSTRACT

A method of forming an electronic device is provided that includes forming a resist layer over a substrate having a first region, a second region, and a third region. The method further includes directing radiation through a reticle, wherein the reticle comprises different radiation zones having significantly different transmission values with respect to each other, and the first region is exposed to a significantly different amount of radiation as compared to the second region. The method also includes removing part of the resist layer to leave a remaining portion such that the second region of the resist layer is significantly thinner than the third region of the resist layer, and then ion implanting the substrate while the remaining portion of the resist layer overlies the substrate to form a first implant region and a second implant region having different depths.

20 Claims, 8 Drawing Sheets

METHODS OF FORMING ELECTRONIC DEVICES BY ION IMPLANTING

CROSS-REFERENCE TO RELATED APPLICATION(S)

BACKGROUND

1. Field of the Disclosure

This disclosure relates to methods of forming electronic devices, and more particularly, to ion implanting regions having deep implant regions relative to adjacent shallow implant regions.

2. Description of the Related Art

Typically implant regions are formed through a series of processes, including for example masking, implanting, and possibly a thermal treatment process. Even more processing steps may be used to form implant regions of different junction depths, such as an implant region having a shallow junction region and a deep junction region relative to the shallow junction region. FIGS. 1-2 illustrate a known method of forming an implant region having different depths. In FIG. 1, a resist layer 103 is formed over a substrate 101. The resist layer 103 includes an opening 104 wherein the substrate 101 is exposed. During processing, ions are directed at the work surface including the resist layer 103 and the opening 104, such that the ions are implanted within the substrate 101 only in the portion of substrate underlying the opening 104 in the resist layer 103, thereby forming a implant region 107.

Referring to FIG. 2, after forming the implant region 107, the resist layer 103 can be removed and replaced with a different resist layer 109. The resist layer 109 has an opening 110 that is wider and overlying the implant region 107 and portions of the substrate 101. An ion implanting process can be completed to form a second implant region 113 in the portion of the substrate 101 underlying the opening 110. By comparison, the second implant region 113 has a shallower junction depth than the previously formed implant region 107 thereby forming a shallow junction region and a deep junction depth region. Thus, two separate resist layers 103 and 109 are used to form the implant regions 107 and 113.

BRIEF DESCRIPTION OF THE DRAWINGS

The present disclosure may be better understood, and its numerous features and advantages made apparent to those skilled in the art by referencing the accompanying drawings.

Figure 1:
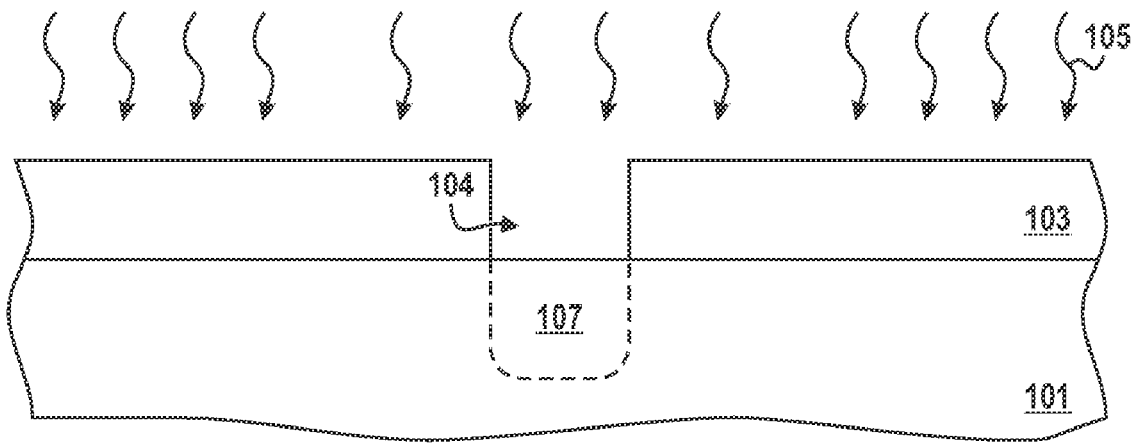
FIG. 1 includes a cross-sectional illustration of a portion of a substrate and an overlying layer during a first ion implanting process to form an implant region in accordance with a prior art method.
Figure 2:
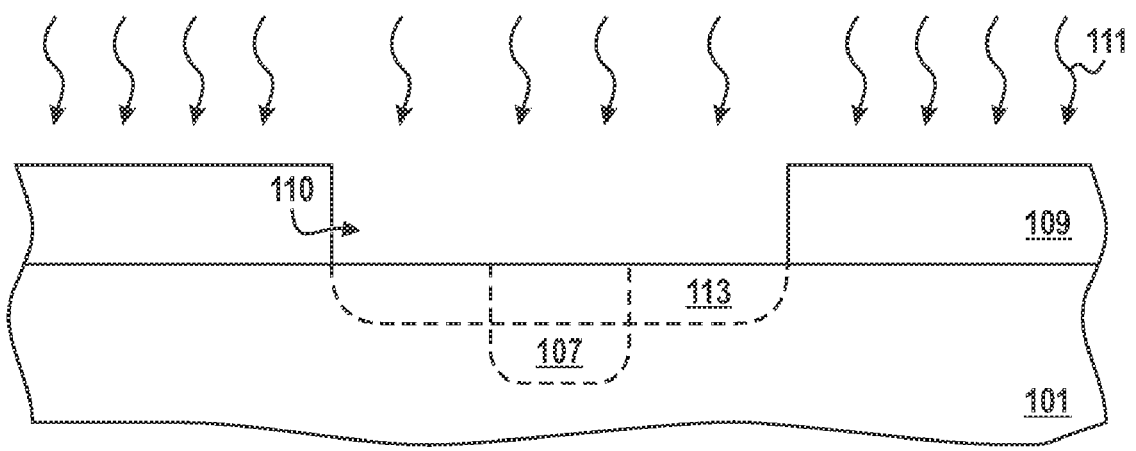
FIG. 2 includes a cross-sectional illustration of a portion the substrate from FIG. 1 and a new overlying layer during a second ion implanting process to form a second implant region in accordance with a prior art method.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process of forming an electronic device can include forming a resist layer over a substrate, wherein the resist layer has a first region, a second region, and a third region, such that the second region is between the first region and the third region. After forming the resist layer, the radiation can be directed through a reticle to expose the resist layer, such that the first region of the resist layer is exposed to a significantly different amount of radiation as compared to the second region of the resist layer. The process can further include removing part of the resist layer to leave a remaining portion, and within the remaining portion, the second region of the resist layer is significantly thinner than the third region of the resist layer. After removing portions of the resist layer, the process can further include ion implanting the substrate while the remaining portion of the resist layer overlies the substrate to form a first implant region within the substrate and a second implant region within the substrate, wherein the first implant region is significantly deeper than the second implant region.

In an exemplary, non-limiting embodiment, during the ion implanting process of the substrate, the second implant region is formed substantially underlying the second region of the resist layer. Such an implanting process facilitates the formation of an implant region having a relatively deep implant region and a relatively shallow implant region, wherein the deep implant region has a junction depth that is significantly greater than the junction depth of the shallow implant region.

Moreover, the reticle can have different radiation zones, such as a first radiation zone, a second radiation zone, and a third radiation zone. The first radiation zone, second radiation zone, and third radiation zone can have significantly different transmission values with respect to the radiation directed at the reticle. In exemplary, non-limiting embodiment, radiation transmitted through one radiation zone is not significantly phase shifted with respect to radiation transmitted through another radiation zone. These features, among others, can facilitate forming an implant region having a relatively deep implant region and a relatively shallow implant region in less steps than previously recognized, and without the additional technical concerns of properly aligning two layers over the implant region. Therefore, costs and technical complexity associated with additional processing, and more particularly repetitive processes such as alignment, masking, patterning, and removal have been reduced, thereby facilitating more efficient and precise formation of an electronic device.

Figure 3:
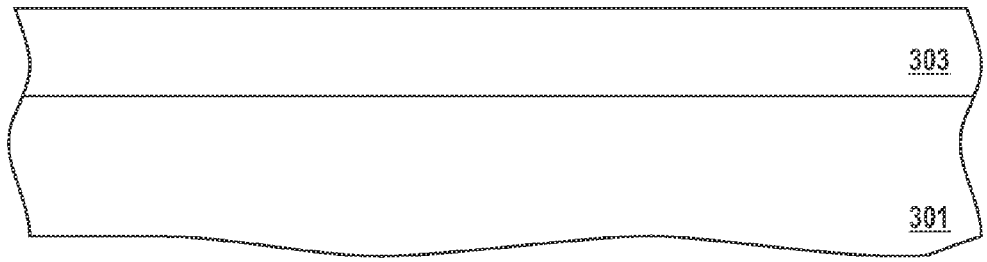
FIG. 3 includes a cross-sectional illustration of a portion of a workpiece including a substrate and a resist layer formed over the substrate in accordance with one embodiment.

Attention is now directed to particular embodiments of forming an electronic device, as illustrated in FIGS. 3-15. FIG. 3 includes a cross-sectional illustration of a portion of a workpiece including a substrate 301 and an overlying resist layer 303. The substrate 301 is a workpiece facilitating the formation of electronic components thereon. Generally, the substrate 301 can include a semiconductive material or an insulative material, or any combination thereof. For example, the substrate can include a monocrystalline semiconductor wafer, semiconductor-on-insulator (SOI) wafer, a flat panel display (e.g., a silicon layer over a glass plate), or other substrate conventionally used to form electronic devices. Additionally, the substrate 301 can be doped, such that it includes a n-type or p-type dopant.

The resist layer 303 overlies the substrate 301, and facilitates masking of certain portions of the substrate in preparation for further processing to form electronic components thereon. Generally, the resist layer 303 includes an organic material, such as a radiation sensitive organic material useful in photolithography processing, for example, diazonaphthoquinone (DNQ), novolac resin, or other suitable positive resist type material. Alternatively, the resist layer 303 may also be a negative resist type material, in which those portions that are exposed to the radiation and are not removed. The process described below uses a positive type resist material.

The resist layer 303 is formed over the substrate 301 using a conventional or proprietary technique, such as a spin coating process. After formation, the averaged thickness of the resist layer 303 is typically not greater than approximately 5 microns. In one particular embodiment, the resist layer 303 is formed such that the averaged thickness is within a range between approximately 0.5 microns to approximately 1.5 microns. As used herein, the term "averaged" refers to a geometric mean, an average, or a median.

Figure 4:
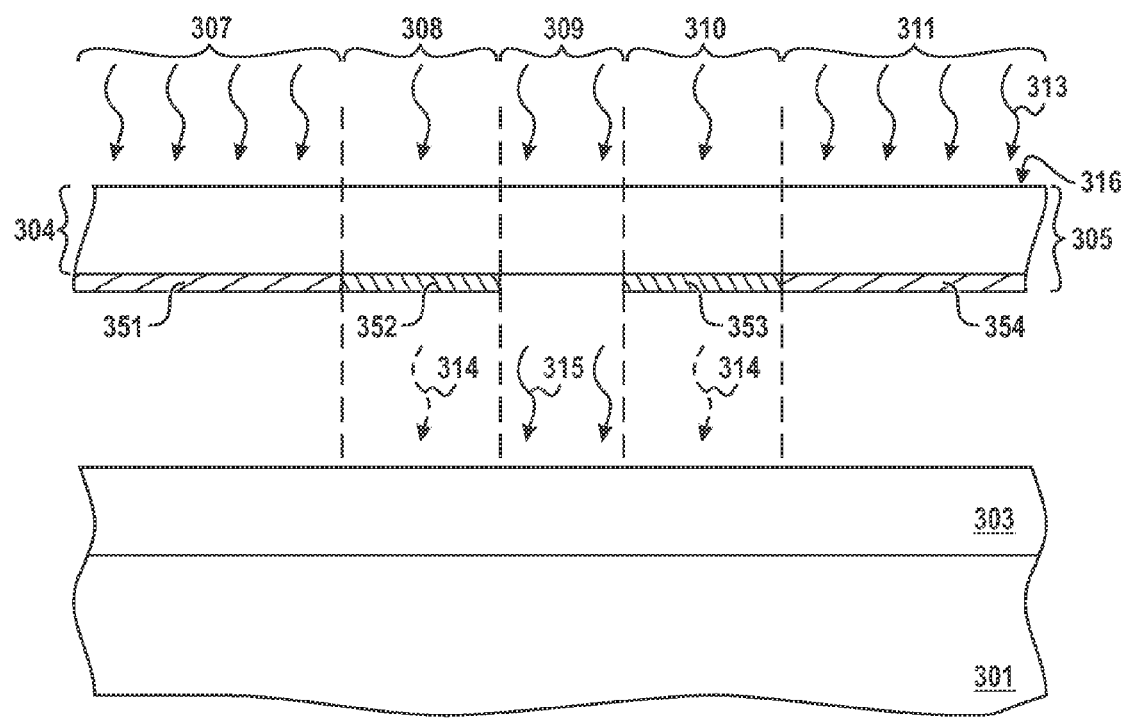
FIG. 4 includes a cross-sectional illustration of the portion of the workpiece of FIG. 3 and a reticle overlying the workpiece during an exposure process in accordance with one embodiment.

FIG. 4 includes a cross-sectional illustration of the portion of the workpiece of FIG. 3 and a reticle 305, overlying the resist layer 303 during an exposure process. The reticle 305 is provided above the resist layer 303 such that during the exposure process, radiation 313 is directed at the top surface 316 of the reticle 305 and may be transmitted through certain radiation zones within the reticle 305 thereby facilitating patterning of the resist layer in preparation for further processing to form electronic components. The reticle 305 can include a base 304 typically made of a material substantially transparent to the radiation 313. In accordance with one embodiment, the base 304 is a quartz plate. Generally, the incident radiation 313 directed at top surface 316 of the reticle 305 has a wavelength of approximately 365 nm or less.

During an exposure process, the radiation 313 is directed at the reticle 305 within different radiation zones 307, 308, 309, 310 and 311 (307-311) that have different amounts of transmission with respect to the radiation 313. As illustrated, the radiation zones 307-311 extend from the top of the reticle 305 to the top surface of the resist layer 303 and correspond to coatings 351, 352, 353, and 354 (351-354), on the bottom surface of the reticle 305. In particular, the coatings 351-354, or absence thereof, can determine the amount of radiation transmitted to the surface of the resist layer 303 within a respective radiation zone. Accordingly, in one embodiment, during the exposure process, substantially none of the radiation 313 is transmitted to the resist layer 303 through radiation zones 307 and 311. The coatings 351 and 354 within the radiation zones 307 and 311 can include a particular material facilitating the substantially opaque properties with respect to radiation 313. In one embodiment, the coatings 351 and 354 can include a metal, refractory metal, or metal alloy, for example, chromium, gold, or silver, or another material capable of absorbing or reflecting the radiation 313. Additionally, coatings 351 and 354 can include an inorganic compound containing a metal or refractory metal combined with other elements, such as silicon, oxygen, nitrogen, or any combination thereof. According to one embodiment, the coatings 351 and 354 are made of chromium.

During the exposure process, the radiation 313 is partially transmitted within the radiation zones 308 and 310. The radiation zones 308 and 310 have a significantly greater transmission value than radiation zones 307 and 311. Accordingly, a significant fraction of the radiation 313 is transmitted within the radiation zones 308 and 310 to the resist layer 303 as transmitted radiation 314. In particular, the radiation zones 308 and 310 correspond to and include the coatings 352 and 353. The coatings 352 and 353 can include particular materials facilitating the partially transmissive properties with respect to the radiation 313. Suitable materials for the coatings 352 and 353 can include metals, refractory metals, or metal alloys, for example, molybdenum (Mo), titanium (Ti), tantalum (Ta), chromium (Cr), tungsten (W), any combination thereof, or another metal capable of partially transmitting radiation 313. Moreover, the coatings 352 and 353 can include a compound including other elements, such as silicon, oxygen, nitrogen, or any combination thereof. In accordance with one particular embodiment, the top surface 316 of the radiation zones 308 and 310 is made of molybdenum oxide.

The portions of the reticle 305 (i.e., the base 304 and the coatings 352 and 353) within the radiation zones 308 and 310 can be made of a substantially continuous layer of material having a substantially uniform cross-sectional thickness. In accordance with one embodiment, the base 304 and coatings 352 and 353 of the reticle 305 within the radiation zones 308 and 310 do not need to include open portions, such as used in an optical grating.

The portion of the reticle 305 within the radiation zone 309 has a transmission value that is significantly greater than portions of the reticle 305 within radiation zones 307, 308, 310, and 311. In one embodiment, the radiation zone 309 can be substantially transparent, such that substantially all of the incident radiation 313 is transmitted through the reticle 305 within the radiation zone 309 to the resist layer 303 as transmitted radiation 315. As illustrated, the bottom surface of the reticle 305 within the radiation zone 309 does not need to have a coating.

The transmitted radiation 314 within the radiation zones 308 and 310 has a phase angle, and the transmitted radiation 315 within the radiation zone 309 also has a phase angle, which may be the same or different from the phase angle of the transmitted radiation 314. In accordance with one embodiment, the difference in phase angles between the transmitted radiation 314 and 315 is not significantly phase shifted. In particular, the difference between the phase angle of the transmitted radiation 314 and the phase angle of transmitted radiation 315 is typically not greater than approximately 90°. In some embodiments, the difference in the phase angle can be less, such as not greater than approximately 60°, or even not greater than about 45°.

Figure 5:
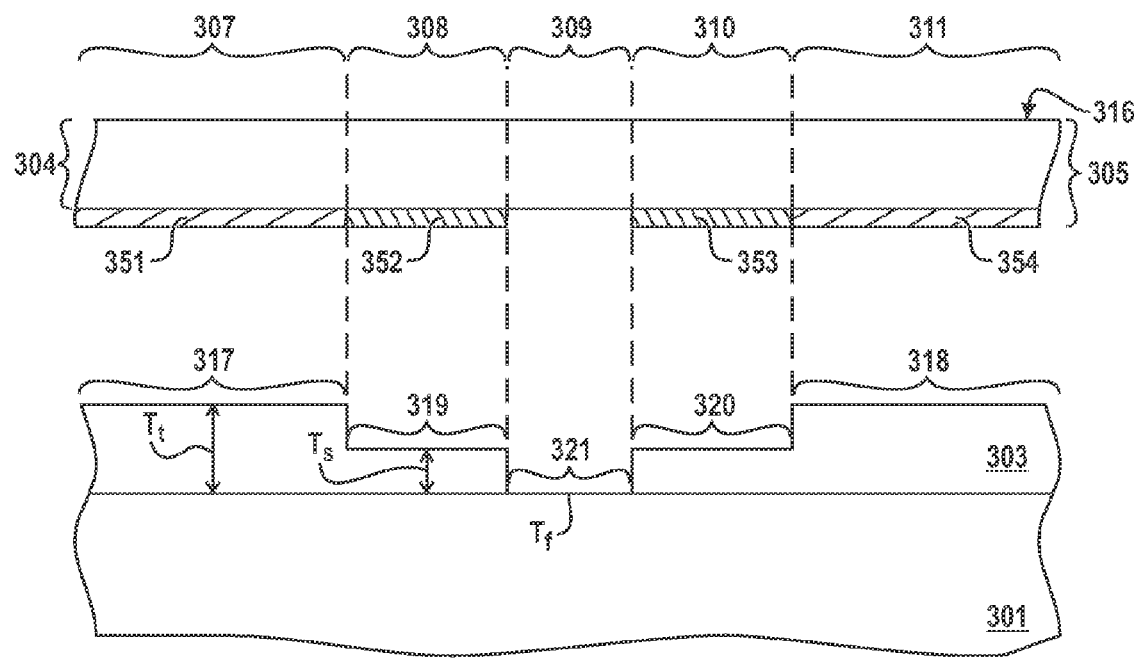
FIG. 5 includes a cross-sectional illustration of the portion of the workpiece of FIG. 4 after removing portions of the resist layer in accordance with one embodiment.

FIG. 5 includes a cross-sectional illustration of the portion of the workpiece of FIG. 4 after removal of portions of the resist layer 303. Portions of the resist layer 303 can be removed using a conventional or proprietary technique, such as developing followed by a hard bake.

As illustrated, the regions 317, 318, 319, 320, and 321 within the resist layer 303 substantially correspond to the radiation zones 307-311. Regions 317 and 318 correspond to the substantially opaque radiation zones 307 and 311 and the thickness of the resist layer 303 within regions 317 and 318 is significantly greater than the thickness of the resist layer 303 within regions 319-321. During the exposure step, the resist layer 303 within regions 317 and 318 is not significantly exposed to transmitted radiation. Accordingly, during the removal process, the initial thickness of the resist layer 303 within regions 317 and 318 is substantially maintained.

The remaining thickness of the resist layer 303 within regions 319 and 320 can be substantially the same as each other. Moreover, the thickness of the resist layer 303 within regions 319 and 320 can be significantly less than the initial thickness of the resist layer 303 remaining within regions 317 and 318. The regions 319 and 320 correspond to the partially transmissive radiation zones 309 and 310, and thus during the exposure process, the portions of the resist layer 303 within these regions 319 and 320 primarily received transmitted radiation 314 (as illustrated in FIG. 4). As such, during the removal process, the thickness of the resist layer 303 within regions 319 and 320 is significantly reduced as compared to the initial thickness of the resist layer 303. Typically, the thickness of the remaining portion of the resist layer 303 within regions 319 and 320 is not greater than approximately 75% of the initial thickness of the resist layer 303. In one particular embodiment, the thickness of the portions of the resist layer 303 remaining within regions 319 and 320 is not greater than approximately 60% of the initial thickness of the resist layer 303. Still, the thickness of the portions of the resist layer 303 remaining within regions 319 and 320 is generally at least approximately 25% of the initial thickness. In another embodiment, the thickness of the portions of the resist layer 303 remaining within regions 319 and 320 is within a range between approximately 25% and approximately 50% of the initial thickness.

During the removal process, the resist layer 303 within region 321 can be substantially removed such that substantially no resist layer 303 remains. Region 321 corresponds to the transparent radiation zone 309 and is primarily exposed to transmitted radiation 315 (as illustrated in FIG. 4). Because the portion of the resist layer 303 within region 321 is exposed to the greatest amount of transmitted radiation 325 compared to the resist layer 303 within the other regions 317-320, during the removal process, the greatest thickness of resist layer 303 is removed within region 321 as compared to the other regions 317-320. Typically, during the removal process, the resist layer 303 within the region 321 is completely removed; however, other embodiments may leave a remaining portion of resist layer 303 within the region 321. In such embodiments, the thickness of the remaining portion of the resist layer within region 321 is generally not greater than approximately 5% of the initial thickness of the resist layer 303.

In more detailed reference to the thickness of the resist layer 303 within particular regions 317-321, in one embodiment, a step thickness ratio ($T_s:T_t$) may describe the relationship between the averaged thickness of the remaining resist layer 303 within region 319 and the averaged thickness of the resist layer 303 remaining within region 317. The step thickness ratio ($T_s:T_t$) has is at least approximately 1:2. Stated alternatively, the averaged thickness of the resist layer 303 within region 319 is at least approximately half of the averaged thickness of the resist layer 303 within region 317. Other removal procedures may vary the second step thickness ratio such that it is at least approximately 1:3, or at least approximately 1:4, or even at least approximately 1:5. As used herein, the term "averaged" can include a geometric mean, an average, or a median.

In accordance with another embodiment, a step thickness ratio ($T_f:T_s$) is defined between regions 321 and 319. In particular, the step thickness ratio ($T_f:T_s$) is at least approximately 1:10, where $T_f$ is the averaged thickness of any resist layer remaining in region 321, and $T_s$ is the averaged thickness of the resist layer in region 319. State alternatively, the averaged thickness of any remaining resist layer 303 within region 321 is at most approximately one tenth of the averaged thickness of the resist layer 303 within regions 319 or 320. In other embodiments, the ratio ($T_f:T_s$) can be at least approximately 1:12, or at least approximately 1:15, or even may be even greater, such as at least approximately 1:20. In embodiments where the resist layer 303 is substantially removed within the region 321, this particular step thickness ratio ($T_f:T_s$) may not be considered.

Another step thickness ratio ($T_f:T_t$) can be described as the relationship between the averaged thickness of the resist layer 303 remaining within region 321 and the averaged thickness of the resist layer 303 within region 317. Generally, the step thickness ratio ($T_f:T_t$) is at least approximately 1:20. Other removal procedures may vary the third step thickness ratio, such that it is at least approximately 1:25, or even at least approximately 1:40. Again, in embodiments where the resist layer 303 is substantially removed within the region 321, this particular step thickness ratio ($T_f:T_s$) may not be considered.

In reference to actual thicknesses of the resist layer 303 remaining within the regions 317-321, in accordance with one embodiment, the averaged thickness of the resist layer 303 remaining within region 321 is within a range between approximately 0 nm and approximately 5 nm. In another embodiment, the averaged thickness of the remaining resist layer within regions 319 and 320 is generally not greater than about 0.9 microns. In still another embodiment, the averaged thickness of the remaining resist layer within regions 317 and 318, is not greater than the initial thickness, such as approximately 5 microns or less.

As illustrated, the thickness of the resist layer 303 within the regions 317-321 substantially corresponds to the amount of radiation transmitted through the reticle 305 within the radiation zones 307-311 during the exposure process. In one embodiment, regions within the resist layer 303 receiving greater amounts of radiation have correspondingly less thickness after the developing the resist layer 303. Use of such a reticle 305 facilitates the formation of a resist layer 303 having regions of varying thicknesses in one exposure process and one removal process.

Figure 6:
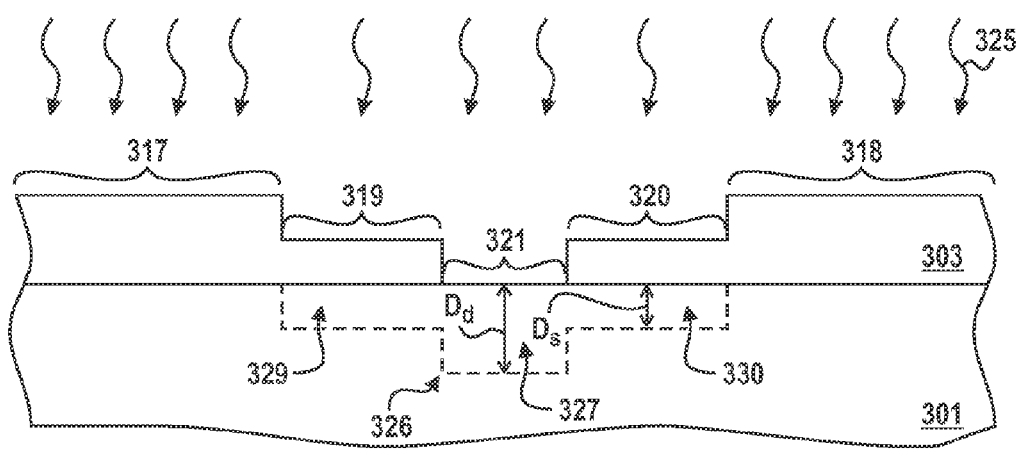
FIG. 6 includes a cross-sectional illustration of the portion of the workpiece of FIG. 5 during an ion implanting technique in accordance with one embodiment.

FIG. 6 includes a cross-sectional illustration of the portion of the workpiece of FIG. 5 during an ion implanting process. During the ion implanting process, ions are directed at the surface of the resist layer 303 and the substrate 301 for penetration into the substrate 301 and the formation of an implant region 326. Suitable ions 325 for implanting within the substrate 301 can include a dopant. The dopant can include a n-type dopant or a p-type dopant. For example, the dopant can include boron, phosphorous, arsenic, antimony, another suitable material, or the like.

During the implanting process, the ions 325 have a sufficient energy such that a significant fraction of the ions 325 can penetrate the remaining thickness of the resist layer 303 within regions 319-321; however, no more than an insignificant amount of the ions 325 penetrate the thickness of the resist layer 303 within regions 317 and 318. In one embodiment, the energy of the ions 315 is greater than approximately 10 KeV. Other implantation processes may use ions 325 having a greater energy, such as not less than approximately 20 KeV, or not less than approximately 40 KeV. Still, in accordance with one embodiment, the energy of the ions 325 is generally within a range between approximately 40 KeV to approximately 80 KeV.

The implant region 326 includes a deep implant region 327 between two shallow implant regions 329 and 330, wherein the deep implant region 327 has a junction depth that is significantly greater than the junction depth of the shallow implant regions 329 and 330. In particular, the deep implant region 327 substantially underlies region 321, wherein the resist layer 303 is substantially removed. The shallow implant regions 329 and 330 substantially underlie regions 319 and 320 respectively, wherein a significantly greater thickness of the resist layer 303 remains as compared to the thickness of the resist layer remaining within region 321. The remaining resist layer 303 within regions 319 and 320 block some of the ions from being implanted into the shallow implant regions 329 and 330. Thus, implant regions 329 and 330 have less dopant than implant regions 327 and are shallower than the deep implant region 327. Shallow implant regions 329 and 330 can have a different resistivity than the implant region 327. Thus, the implant region 326, including the deep implant region 327 and shallow implant regions 329 and 330 can be formed using a single ion implanting process.

A particular relationship exists between the depth of the junction within the deep implant region 327 as compared to the depth of the junction within the shallow implant regions 329 and 330. This relationship can be expressed as a junction depth ratio ($D_d$:$D_s$) wherein $D_d$ is the depth of the junction within the deep implant region 327, and $D_s$ is the depth of the junction within one of the shallow implant regions 329 or 330. Typically, the junction depth ratio is at least approximately 4:3. In one embodiment, the depth of the junction within the shallow implant region is generally not greater than approximately 75% of the depth of the junction within the deep implant region 327. Still, other embodiments may have a greater distinction between the depth of the junction within the deep implant region and the shallow implant region, such that $D_d$:$D_s$ is at least approximately 2:1, or at least approximately 3:1. Generally, the $D_d$:$D_s$ is within a range between approximately 4:3 to approximately 4:1. It will be appreciated, that measurements of the depths of the junctions within the deep implant region 327 and shallow implant regions 329 and 330 are measured at the centers of these regions, as illustrated by the arrows representing $D_d$ and $D_s$ in FIG. 6.

The implant regions described herein have at least one distinct shallow implant region adjacent to a distinct deep implant region. Generally, before an annealing operation of the implant region 326, portions of the contour defining the junction, particularly between the shallow implant regions 329 and 330 and the deep implant region 327, can be substantially vertical and define a plane intersecting the surface of the substrate 301 at a substantially perpendicular angle. Moreover, portions of the contour defining the junction, particularly portions of the contour within the centers of the shallow implant regions 329 and 330 and the deep implant region 327, have a substantially horizontal portion that defines a plane which is substantially parallel with the surface of the substrate 301.

Figure 7:
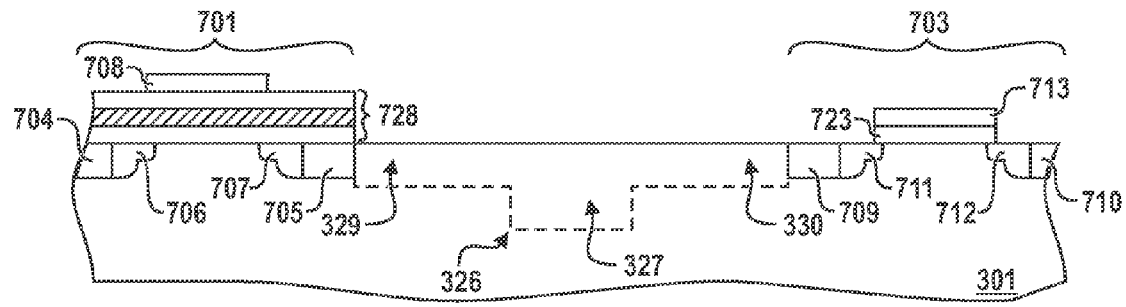
FIG. 7 includes a cross-sectional illustration of the portion of the workpiece of FIG. 6 after removing the remaining resist layer and the formation of electronic components in accordance with one embodiment.

FIG. 7 includes a cross-sectional illustration of the portion of the workpiece of FIG. 6 after removing the remaining resist layer and forming electronic components in accordance with an embodiment. As illustrated, the implant region 326 is positioned between a first electronic component 701 and a second electronic component 703. The electronic components 701 and 703 include transistor structures. In another embodiment (not illustrated), the electronic components 701 and 703 can include a transistor, a diode, a capacitor, a resistor, an inductor, or any combination thereof. Moreover, the workpiece can include many other electronic components that may be substantially the same or different from the electronic components 701 and 703.

As compared to each other, the electronic components 701 and 703 may operate at significantly different voltages. The implant region 326 may help to further isolate the electronic components 701 and 703, so that the normal operation of one of the electronic components does not significantly interfere with the normal operation of the other electronic component. In a particular embodiment, the electronic component 701 may normally operate at a voltage significantly higher than the normal operation voltage for the electronic component 703. For example, the electronic component 701 may operate at a voltage of at least approximately 9 V, and in another embodiment can exceed approximately 15 V, or even approximately 40 V. The electronic component 703 may operate at a voltage not greater than approximately 5 V and may operate at a voltage of approximately 3.3 V, or lower. In a particular embodiment, the electronic component 701 can be a nonvolatile memory cell, as illustrated in FIG. 7, a power transistor (not illustrated), another suitable high voltage electronic component, or any combination thereof. The power transistor can include an insulated gate bipolar transistor or other bipolar transistor, a laterally diffused metal-oxide-semiconductor ("MOS") transistor, a U-shaped MOS or V-shaped MOS transistor, or the like. The electronic component 703 can include a logic transistor, a random access memory cell, another suitable electronic component used in transistor-to-transistor logic, or any combination thereof.

The electronic component 701 as illustrated in FIG. 7 can include a charge storage stack 728 and a gate electrode 708. The charge storage stack 728 can include an oxide layer, a nitride layer, and another oxide layer. Source/drain regions 706 and 707 are formed within the substrate 301. The electronic component 703 can include a gate dielectric layer 723 and a gate electrode 713. Source/drain regions 711 and 712 are formed within the substrate adjacent to the sides of the gate electrode 713. The electronic components 701 and 703 are isolated from other components by field isolation regions 704, 705, 709, and 710. The electronic components 701 and 703 and the field isolation regions 704, 705, 709, and 710 can be formed using conventional for proprietary techniques.

When the electronic component 701 is a nonvolatile memory cell, the nonvolatile memory cell may be programmed or erased at voltages significantly higher than the normal operating voltages for the electronic component 703. For example, the nonvolatile memory cell may be programmed at voltages as high as 8 to 10 volts, and may be erased at voltages that can be in a range of 10 to 20 volts. The electronic component 703 may operate at voltages no higher than approximately 3.3 volts and may continue to decrease as the size of electronic components continue to shrink. The implant region 326 can help to form a guard band around the high voltage or the low voltage electronic components to provide further isolation beyond the isolation provided by the field isolation regions 704, 705, 709, and 710 by themselves.

Figure 8:
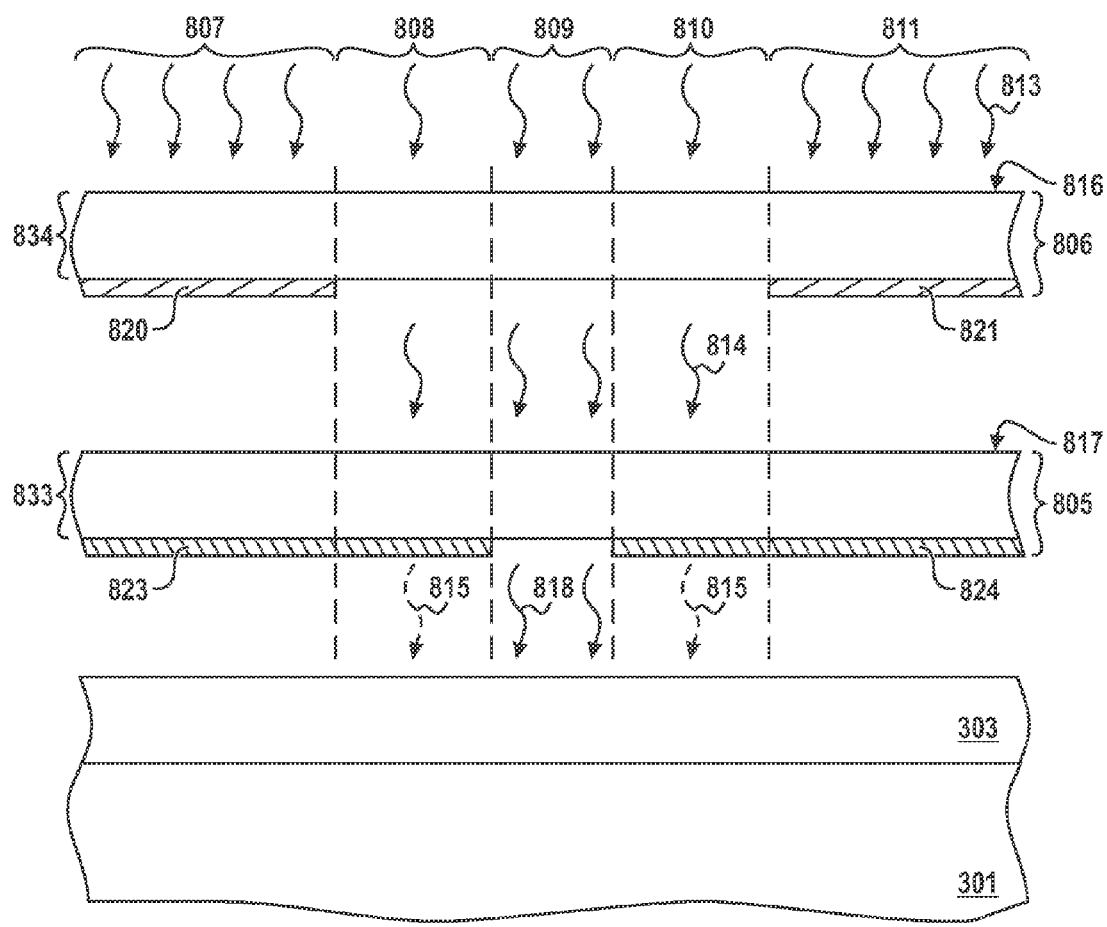
FIG. 8 includes a cross-sectional illustration of a portion of a workpiece including a substrate, a resist layer, and two reticles used during an exposure process in accordance with one embodiment.
Figure 9:
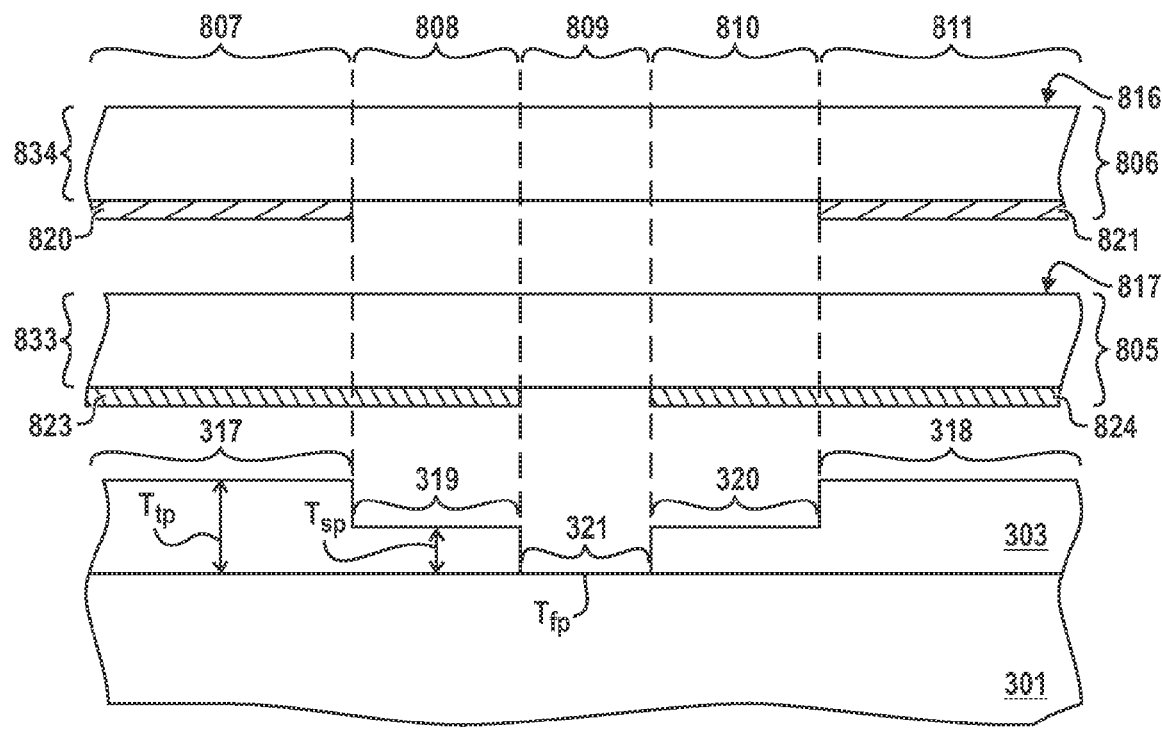
FIG. 9 includes a cross-sectional illustration of the portion of the workpiece of FIG. 8 after portions of the resist layer have been removed in accordance with one embodiment.

FIGS. 8-9 include an alternative embodiment, and particularly illustrate the use of reticles to form a patterned resist layer to facilitate the formation of an implant region having a deep implant region and a shallow implant region. FIG. 8 includes a cross-sectional illustration of a portion of a workpiece including a substrate 301, a resist layer 303 overlying the substrate 301, a reticle 805 overlying the resist layer 303, and a reticle 806 overlying the reticle 805 during an exposure process. During the exposure process, radiation 813 is directed at the top surface 816 of the reticle 806 and can be transmitted differently through different radiation zones 807, 808, 809, 810, and 811 (807-811) facilitating patterning of portions of the resist layer 303 in preparation for further processing to form electronic components. The reticles 805 and 806 can include bases 833 and 834 respectively, made of a transparent material, such as quartz. Additionally, the reticles 805 can 806 may include coatings on the bottom surface corresponding to certain radiation zones 807-811.

During the exposure process, incident radiation 813 is directed at the top surface 816 of the reticle 806. The portions of the reticle 806 within the radiation zones 807 and 811 have a significantly different transmission value than portions of the reticle 806 within radiation zones 808, 809, and 810. In particular, radiation zones 807 and 811 correspond to the coatings 820 and 821, which are substantially opaque, such that substantially none of the incident radiation 813 is transmitted through the radiation zones 807 and 811 to the reticle 805 during the exposure process. The coatings 820 and 821 can include particular materials facilitating substantially opaque properties within the radiation zones 807 and 811 with respect to radiation 813. Generally, the coatings 820 and 821 can include a metal, or metal alloy, for example, chromium, gold, or silver, or another metal capable of absorbing or reflecting the radiation 813. In another embodiment, coatings 820 and 821 can include an inorganic compound containing a metal or refractory metal combined with other elements, such as silicon, oxygen, nitrogen, or any combination thereof.

During the exposure process, portions of the reticle 806 within the radiation zones 808-810 can have a transmission value with respect to radiation 813 that is significantly greater than the portions of the reticle 806 within the radiation zones 807 and 811. In one particular embodiment, the portions of the reticle 806 within the radiation zones 808-810 are substantially transparent with respect to the radiation 813. As such, during an exposure process, radiation zones 808-810 can transmit substantially all of the incident radiation 813 through to the reticle 805 as transmitted radiation 814. Moreover, the bottom surface of the reticle 806 within the radiation zones 808-810 does not need a coating.

Additionally, the spacing between the reticles 805 and 806, or lack thereof, can be controlled during the exposure process to facilitate control of the features formed within the resist layer 303. Some spacing may be suitable between the reticles 805 and 806 such that less rectilinear profiles can be created within the resist layer 303. Generally, the spacing between the reticles 805 and 806 is not greater than about 2 cm. In other embodiments, the spacing is less, such as not greater than about 1 mm, or not greater than about 500 microns, or even not greater than about 250 microns. In one particular embodiment, substantially no space exists between the reticles 805 and 806 such that the coatings 820 and 821 on the bottom surface of the reticle 805 are in direct contact with the upper surface 817 of the reticle 805.

During the exposure process, the transmitted radiation 814 from the reticle 806 is transmitted differently through the radiation zones 808-810. In particular, the portions of the reticle 805 within the radiation zones 808 and 810 have a transmission value that is significantly less than portions of the reticle 805 within the radiation zone 809. In accordance with one embodiment, radiation zones 808 and 810 are partially transmissive with respect to the transmitted radiation 814. As illustrated, the coatings 823 and 824 correspond to the radiation zones 808 and 810 and can include particular materials facilitating partially transmissive properties with respect to the transmitted radiation 814. Suitable materials for the coatings 823 and 824 can include metals, or metal alloys, for example, molybdenum (Mo), titanium (Ti), chromium (Cr), tantalum (Ta), tungsten (W), or another metal capable of providing suitable for partially transmitting radiation 814, any combination thereof. Moreover, the coatings 823 and 824 can include a metal compound including additional materials, such as silicon, oxygen, nitrogen, or any combination thereof. According to one particular embodiment, the coatings 823 and 824 are made of molybdenum oxide.

Moreover, the portions of the reticle 805 within the radiation zone 809 have a significantly greater transmission value than portions of the reticle within radiation zones 808 and 810 with respect to the transmitted radiation 814. In particular, the radiation zone 809 within the reticle 805 can be substantially transparent such that essentially all of the transmitted radiation 814 is transmitted through the radiation zone 809 to the resist layer 303 as transmitted radiation 818. It will be appreciated, that the bottom surface of the reticle 805 within the radiation zone 809 does not need a coating.

The transmitted radiation 815 and 818 corresponding to the different radiation zones 808-810 is not substantially phase shifted, such that deconstructive interference is minimized. In one embodiment, the phase angle difference between the transmitted radiation 815 and 818 is not greater than approximately 90°, and more particularly not greater than approximately 60°.

FIG. 9 includes a cross-sectional illustration of the portion of the workpiece of FIG. 8 after removing portions of the resist layer 303. Notably, FIG. 9 includes regions 317, 318, 319, 320, and 321 within the resist layer 303. After exposing portions of the resist layer 303 to radiation transmitted through the reticles 805 and 806, the exposed portions of the resist layer 303 are removed. Removal of portions of the resist layer 303 can be completed using a conventional or proprietary technique. The resist profile illustrated is substantially similar to the resist profile described in accordance with FIG. 5, having regions 317-321 within the resist layer 303 of varying thicknesses. As such, continued processing of the workpiece, including an ion implanting process to form an implant region having a relatively deep implant region and a relatively shallow implant region, can be completed in the same manner as previous described in accordance with FIG. 6.

Figure 10:
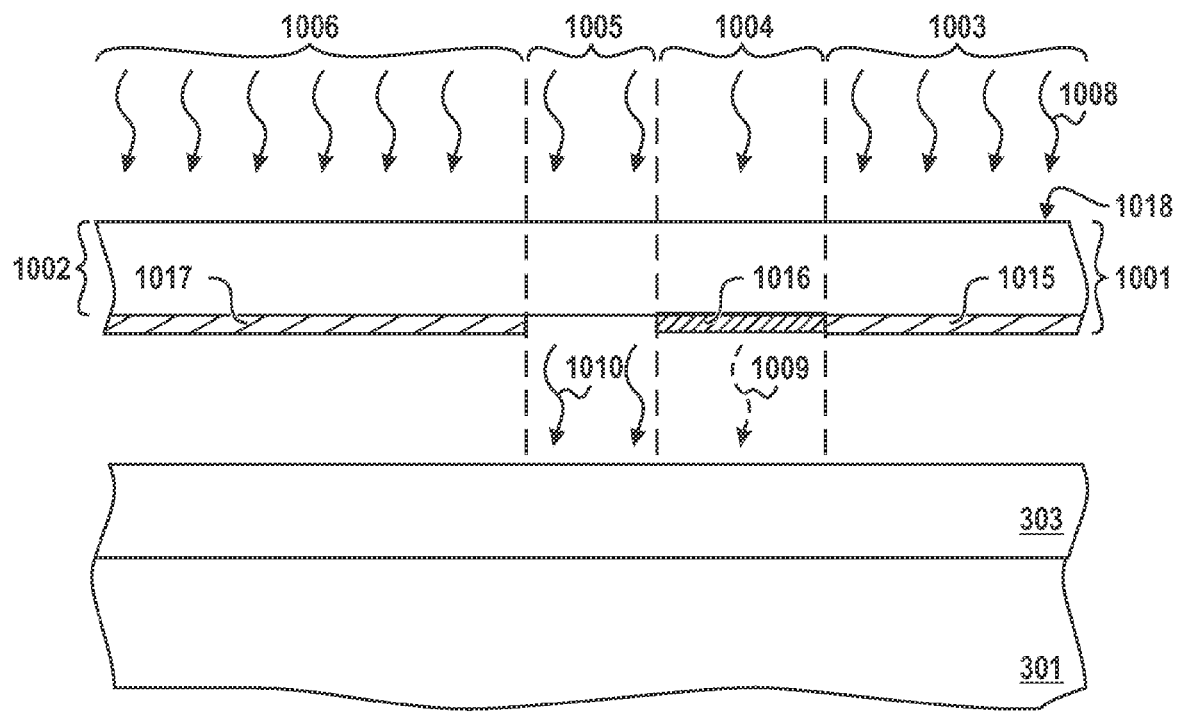
FIG. 10 includes a cross-sectional illustration of a portion of a workpiece including a substrate, a resist layer, and a reticle during an exposure process in accordance with one embodiment.

FIGS. 10-13 provide an alternative embodiment to forming an implant region having a relatively shallow implant region and a relatively deep implant region within a substrate. FIG. 10 includes a cross-sectional illustration of a portion of a workpiece including a substrate 301, a resist layer 303 overlying the substrate 301, and a reticle 1001 overlying the resist layer 303. After the formation of the resist layer 303, portions of the resist layer 303 can be patterned by directing radiation 1008 at the reticle 1001 and transmitting it through different radiation zones 1003, 1004, 1005, and 1006 (1003-1006).

The radiation zones 1003, 1004, 1005, and 1006 correspond to regions of different transmission with respect to the radiation 1008. During the exposure process, portions of the reticle 1001 within the radiation zones 1003 and 1006 can transmit significantly less radiation 1008 than portions of the reticle 1001 within radiation zones 1004 and 1005. In particular, radiation zones 1003 and 1006 can be substantially opaque, transmitting substantially none of the incident radiation 1008 through the reticle 1001 to the resist layer 303. As illustrated, radiation zones 1003 and 1006 correspond to the coatings 1015 and 1017 respectively, which facilitates reduced transmission properties with respect to radiation 1008. As described herein, such coatings 1015 and 1017 can include a metal or metal alloy, for example, chromium, gold, or silver, or another metal capable of absorbing or reflecting the radiation 1008. In one embodiment, coatings 1015 and 1017 can include an inorganic compound containing a metal or refractory metal combined with other elements, such as silicon, oxygen, nitrogen, or any combination thereof.

The portions of the reticle 1001 within the radiation zone 1004 can have a significantly greater transmission value than portions of the reticle 1001 within the radiation zones 1003 and 1006. In one embodiment, the radiation zone 1004 can be partially transmissive and capable of transmitting a portion of the incident radiation 1008 through that portion of the reticle 1001 as transmitted radiation 1009. Accordingly, the radiation zone 1004 corresponds to a coating 1016 facilitating the partially transmissive optical properties with respect to radiation 1008. For example, suitable materials for the coating 1016 can include a metal or metal alloys, for example, molybdenum (Mo), titanium (Ti), chromium (Cr), tantalum (Ta), tungsten (W), or another metal capable of providing suitable for partially transmitting radiation 1008, any combination thereof. Moreover, the coating 1016 can include a metal compound including additional materials, such as silicon, oxygen, nitrogen, or any combination thereof. According to one particular embodiment, the coating 1016 is made of molybdenum oxide.

Moreover, the portions of the reticle 1001 (i.e., the base 1002 and the coating 1016) within the radiation zone 1004 can be a substantially continuous layer of material having a substantially uniform cross-sectional thickness. In one embodiment, the portions of the reticle 1001 within the radiation zone 1004 do not need to include open portions, such as used in an optical grating.

The portion of the reticle 1001 within the radiation zone 1005 can have a significantly greater transmission value than the portions of the reticle 1001 within the radiation zones 1003, 1004, and 1006. For example, radiation zone 1005 can be substantially transparent, and capable of transmitting substantially all of the incident radiation 1008 through the corresponding portion of the reticle 1001 as transmitted radiation 1010. Accordingly, the bottom surface of the reticle 1001 within the radiation zone 1005 does not need a coating.

As described previously, the transmitted radiation 1009 and 1010 corresponding to the radiation zones 1004 and 1005 respectively, is not intentionally phase shifted to cause deconstructive interference. Rather, the difference in phase angles of the transmitted radiation 1009 and 1010 is generally not greater than approximately 90°, and particularly not greater than approximately 60°.

Figure 11:
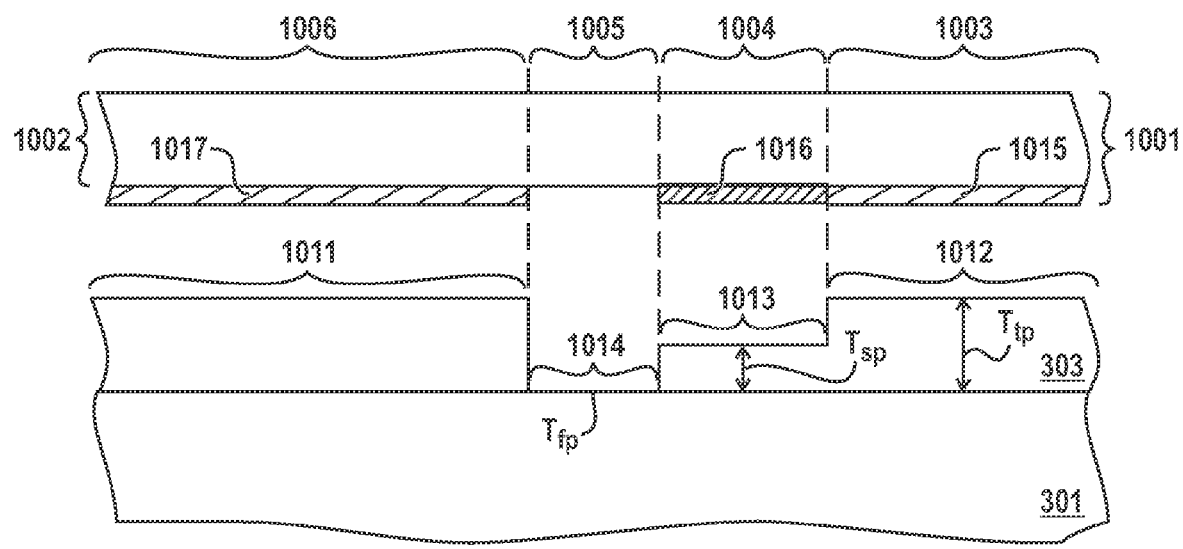
FIG. 11 includes a cross-sectional illustration of the portion of the workpiece of FIG. 10 after portions of the resist layer have been removed in accordance with one embodiment.

FIG. 11 includes a cross-sectional illustration of the portion of the workpiece of FIG. 10 after removing portions of the resist layer 303. Notably, FIG. 11 illustrates the formation of an asymmetric resist profile. The thickness of the resist layer 303 within regions 1011 and 1012, is significantly greater than the thickness of the resist layer 303 within regions 1013 and 1014. Notably, the thickness of the resist layer 303 within the region 1013 has an intermediate thickness of resist layer 303 as compared to the thickness of the resist layer 303 within regions 1011, 1012, and 1014, and is located on only one side of the region 1014. The removal process can be completed using a conventional or proprietary technique. The variations in the thickness of the resist layer 303 within the regions 1011, 1012, 1013, and 1014 are substantially similar to embodiments described herein (see FIG. 5) and correspond to the amount of radiation received within each of the radiation zones 1003-1006.

Figure 12:
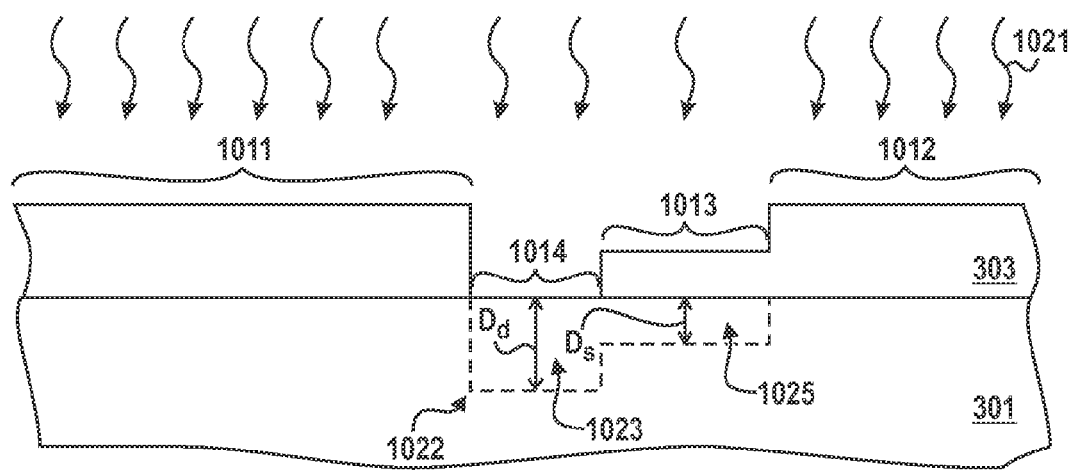
FIG. 12 includes a cross-sectional illustration of the portion of the workpiece of FIG. 11 during an ion implanting technique in accordance with one embodiment.

FIG. 12 includes a cross-sectional illustration of the portion of the workpiece of FIG. 11 including the portion of the substrate 301 and the resist layer 303 having an asymmetric resist profile overlying the substrate 301 during an ion implanting process. During the ion implanting process, ions 1021 are directed at the resist layer 303 and exposed portions of the substrate 301 within region 1014 to form an implant region 1022 within the substrate 301. As illustrated, the implant region 1022 has a deep implant region 1023 and a shallow implant region 1025 adjacent to and in contact with the deep implant region 1023. It will be appreciated that the ion implanting process can be carried out in the same manner, using the same technique and material as described herein. Moreover, the contours of the deep implant region 1023 and shallow implant region 1025, as well as the relationships between the depths of the junctions within the deep implant region 1023 and the shallow implant region 1025 are substantially the same as those previously described in the embodiment of FIG. 6.

Figure 13:
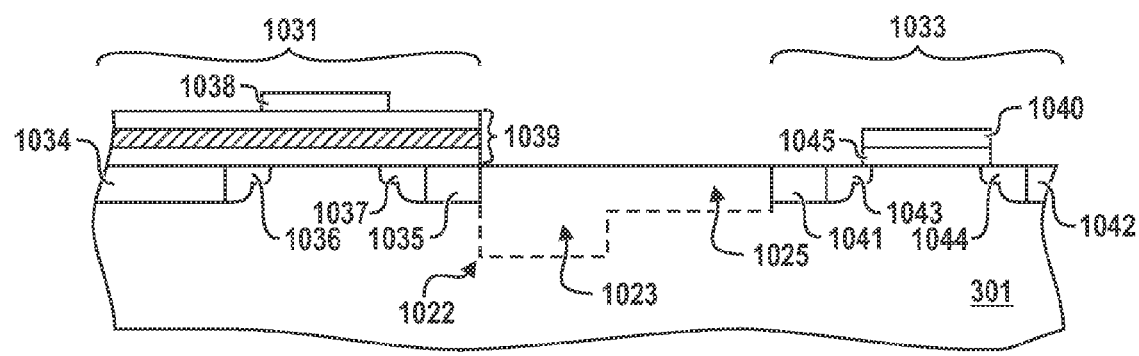
FIG. 13 includes a cross-sectional illustration of the portion of the workpiece of FIG. 12 after removing the remaining resist layer and forming electronic components in accordance with one embodiment.

FIG. 13 includes a cross-sectional illustration of the portion of the workpiece of FIG. 12 after the formation of a first electronic component 1031 and a second electronic component 1033 on either side of the asymmetric implant region 1022. According to this embodiment, the asymmetric implant region 1022 forms a guard band, facilitating electrical isolation between the first electronic component 1031 from the second electronic component 1033. As illustrated in FIG. 13, the electronic components 1031 and 1033 includes transistor structures. In another embodiment (not illustrated), the electronic components 1031 and 1033 can include a transistor, a diode, a capacitor, a resistor, or an inductor. Moreover, the workpiece can include many other electronic components that may be substantially the same or different from the electronic components 1031 and 1033. The electronic components 1031 and 1033 can be substantially similar and include the same characteristics as those described in accordance with the embodiment of FIG. 7.

Figure 14:
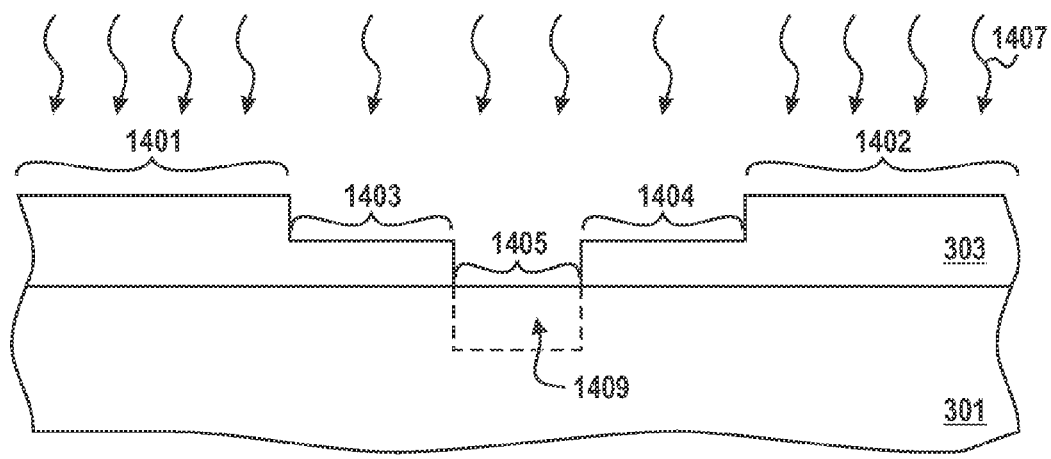
FIG. 14 includes a cross-sectional illustration of a portion of a workpiece including a substrate and a resist layer having portions of different thicknesses during an ion implanting technique in accordance with one embodiment.
Figure 15:
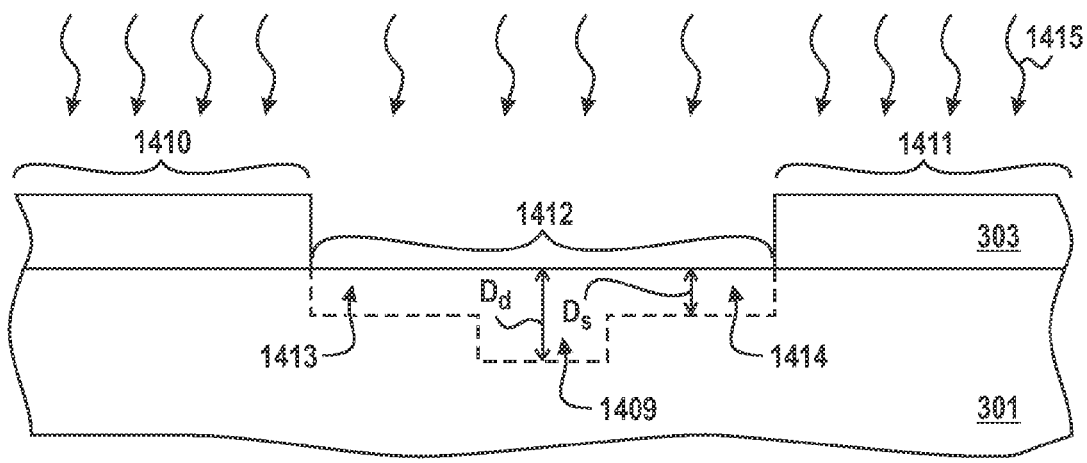
FIG. 15 includes a cross-sectional illustration of the portion of the workpiece of FIG. 14 after a partial etch of the resist layer and during an ion implanting technique in accordance with one embodiment.

FIGS. 14 and 15 provide an alternative embodiment to forming an implant region having a relatively shallow implant region and a relatively deep implant region within a substrate. FIG. 14 includes a cross-sectional illustration of a portion of a workpiece including a substrate 301 and a resist layer 303 having regions 1401, 1402, 1403, and 1405 (1401-1405) of different thicknesses during an ion implanting technique in accordance with one embodiment. The resist layer 303 having regions 1401-1405 of different thicknesses can be formed in accordance with methods described herein. Notably, the thickness of the resist layer 303 within regions 1401 and 1402 is significantly greater than the thickness of the resist layer 303 within regions 1403-1405. The thickness of the resist layer 303 within the regions 1403 and 1404 has an intermediate thickness as compared to the thickness of the resist layer 303 within regions 1401, 1402, and 1405. Moreover, the thickness of the resist layer 303 within region 1405 is significantly thinner than the resist layer within regions 1401-1404. In one particular embodiment, the thickness of the resist layer 303 within region 1405 is substantially removed. Removal of portions of the resist layer 303 can be completed using a conventional or proprietary technique. The comparable differences in the thicknesses, notably the step thickness ratios, of the resist layer 303 within the regions 1401-1405 are substantially similar to embodiments described herein (see FIG. 5) and correspond to the amount of radiation received within different radiation zones.

In one particular embodiment, the initial thickness of the resist layer 303 may be greater than the initial thickness of the resist layer 303 in other embodiments herein. A greater averaged initial thickness of the resist layer 303 facilitates the formation of a first resist profile having regions of different thicknesses and a second resist profile having regions of decreased thickness using a partial etch process. Accordingly, the averaged initial thickness of the resist layer 303 is typically at least approximately 2 microns. In one embodiment, the averaged initial thickness can be at least approximately 3 microns, or even at least approximately 4 microns. In one particular embodiment, the averaged initial thickness is within a range between approximately 1.5 microns and approximately 3.5 microns.

As further illustrated in FIG. 14, during the ion implanting technique, ions 1407 are directed at the surface of the resist layer 303 and the substrate 301 for penetration into the substrate 301 and the formation of an implant region 1409. According to one embodiment, given the substantial thickness of the resist layer 303 remaining within regions 1401-1404, no more than an insignificant amount of ions have sufficient energy to penetrate the resist layer within regions 1401-1404. Thus, no implant region is formed within the substrate 301 underlying regions 1401-1404. An implant region 1409 is formed within the substrate 301 underlying region 1405, where there is substantially no thickness of resist layer 303 remaining.

FIG. 15 includes a cross-sectional illustration of the workpiece of FIG. 14 after a partial etch of the resist layer 303 and during an ion implanting technique in accordance with one embodiment. The partial etch process can include a proprietary or conventional technique. After the partial etch process, the resist layer 303 within the regions previously having an intermediate thickness (i.e., regions 1403 and 1404 of FIG. 14) is significantly thinner in comparison to the thickness of the resist layer within regions 1410 and 1411. In one particular embodiment, the resist layer 303 within the previously identified intermediate regions is substantially removed.

Additionally, after the partial etch process, the thickness of the resist layer 303 within the regions 1410 and 1411 that previously maintained the initial thickness (i.e., regions 1401 and 1402 of FIG. 14) is significantly less than the initial thickness. In one embodiment, the averaged thickness of the resist layer 303 within regions 1410 and 1411 is decreased by not less than approximately 30% during the partial etch process. In another embodiment, the averaged thickness of the resist layer 303 within regions 1410 and 1411 is decreased by not less than approximately 40%, such as not less than approximately 50%, or even not less than approximately 60%. In one particular embodiment, the averaged thickness of the resist layer 303 within regions 1410 and 1411 is within a range of between approximately 40% to approximately 60% of the initial thickness of the resist layer 303.

During the ion implanting technique, ions 1415 are directed at the surface of the resist layer 303 and the substrate 301 for penetration into the substrate 301 and the formation of new implant regions 1413 and 1414 adjacent to the previously formed implant region 1409. Given the substantial thickness of the resist layer 303 remaining within regions 1410 and 1411, no more than an insignificant amount of ions have sufficient energy to penetrate the resist layer within these regions 1410 and 1411. Accordingly, no implant region is formed within the substrate 301 underlying the regions 1401-1404. The new implant regions 1413 and 1414 are formed within the substrate 301 underlying region 1412, wherein in one embodiment, substantially no thickness of resist layer 303 remains. The ion implanting technique can include a proprietary or conventional technique.

In one particular embodiment, the formation of the new implant regions 1413 and 1414 can simultaneously facilitate the formation of a relatively deep implant region 1409, having a junction depth that is deeper within the substrate 301 than the junction depths of the new implant regions 1413 and 1414. Notably, unlike previous embodiments, because of the utilization of separate ion implanting techniques to form the implant region 1409, and new implant regions 1413, and 1414, the type of ions implanted can be the same or different. Accordingly, the implant region 1409 can be the same or different than the new implant regions 1413 and 1414. In one particular embodiment, the ions 1415 are the same type of ions used in the previously formed implant region 1409. The relationship of the junction depths within the implant regions 1409, 1413, and 1414 is the same as those described in accordance with other embodiments provided herein. Use of the partial etch and separate ion implanting techniques facilitates the formation of relatively shallow implant regions and relatively deep implant regions without the additional concerns of alignment of two separate resist layers. Moreover, the implant regions can have the same type of ions or different ions.

Figure 16:
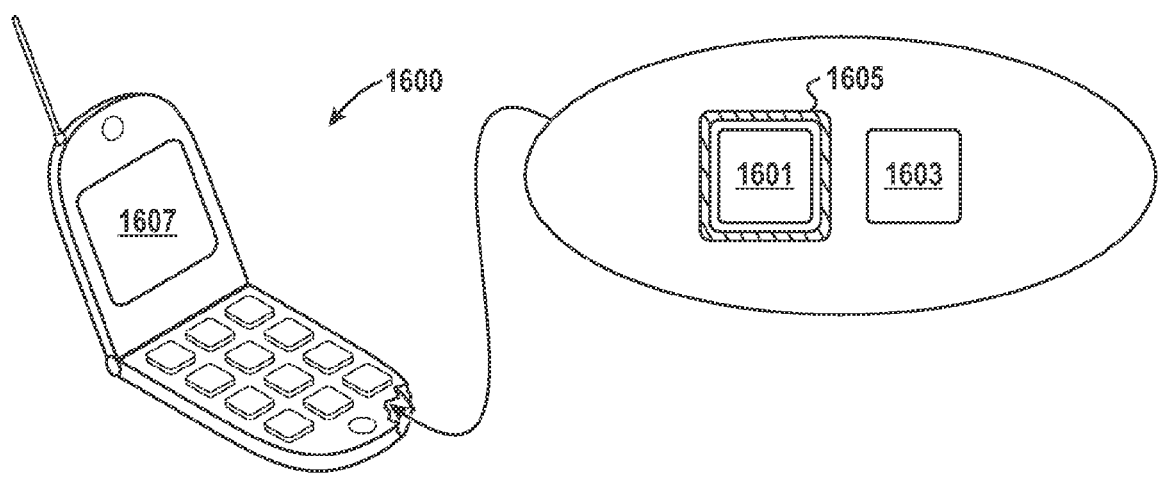
FIG. 16 includes an illustration of a cross-sectional view of a system wherein a processor is coupled to a display and an electronic device formed by a process described herein.

FIG. 16 includes an illustration of a system 1600. The system 1600 includes the electronic device 1605 formed by the process described herein. According to the embodiment, the electronic device 1605 is a guard band disposed around a perimeter region of an electronic component 1601. In one embodiment, the electronic component 1601 can be an integrated circuit that may include memory cells, such as non-volatile memory cells, random access memory cells, other suitable memory cells, or any combination thereof.

The electronic device 1605 operates as a guard band and electrically isolates the electronic component 1601 from an adjacent electronic component 1603. The electronic component 1603 can include a processor which is coupled to a display 1607. The electronic component 1603 can include a central processing unit, a graphical processing unit, another suitable processing unit, or any combination thereof. The electronic component 1603 may be part of a microcontroller, a microprocessor, a digital signal processor, another suitable data processing integrated circuit or the like. In another embodiment, the processor and the electronic device 1605 may reside within the same integrated circuit. In one specific embodiment, the electronic component 1603 can read data from the electronic component 1601 and render or otherwise provide information to be provided to the display 1607 of the system 1600.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming an electronic device comprising:
    forming a resist layer over a substrate, wherein the resist layer has a first region, a second region, and a third region, wherein the second region lies between the first and third regions;
    directing radiation through a reticle to expose the resist layer, wherein the reticle comprises different radiation zones having different transmission values with respect to each other, and wherein the first region of the resist layer is exposed to a different amount of radiation as compared to the second region of the resist layer;
    removing part of the resist layer to leave a remaining portion, wherein within the remaining portion, the second region of the resist layer is thinner than the third region of the resist layer; and
    ion implanting the substrate while the remaining portion of the resist layer overlies the substrate to form a first implant region within the substrate and a second implant region within the substrate, wherein the first implant region is deeper than the second implant region.

2. The method of claim 1, wherein during ion implanting of the substrate the second implant region is formed substantially underlying the second region of the resist layer.

3. The method of claim 2, wherein ion implanting of the substrate further includes forming an implant region having a junction depth ratio ($D_f:D_s$) of at least approximately 4:3, wherein $D_f$ is the depth of the implant region within the first implant region, and $D_s$ is the depth of the implant region within the second implant region.

4. The method of claim 1, wherein directing radiation through the reticle further includes directing radiation at a first radiation zone, a second radiation zone, and a third radiation zone, wherein the first radiation zone includes a first transmission value with respect to the radiation, and the second radiation zone includes a second transmission value with respect to the radiation, and wherein the first transmission value and the second transmission value are different from each other.

5. The method of claim 4, wherein directing radiation through the reticle further includes transmitting the radiation through the first radiation zone at a first phase and transmitting the radiation through the second radiation zone at a second phase, wherein the difference between the first phase and the second phase is less than 90°.

6. The method of claim 4, wherein the third radiation zone is substantially opaque with respect to the radiation and the transmission value of the second radiation zone is greater than the third radiation zone.

7. The method of claim 4, wherein the second radiation zone includes a transmission value that is less than the transmission value of the first radiation zone.

8. The method of claim 4, wherein the second radiation zone includes a substantially continuous layer of material having a substantially uniform cross-sectional thickness.

9. The method of claim 4, wherein the second radiation zone includes Mo, Ti, Cr, Ta, W or any combination thereof.

10. The method of claim 9, wherein the second radiation zone includes an oxide, nitride, or any combination thereof.

11. The method of claim 1, wherein removing part of the resist layer further includes removing a greater portion of the resist layer in the first region than in the second region.

12. The method of claim 1, wherein removing part of the resist layer to leave a remaining portion further includes forming a first step thickness ratio ($T_f:T_s$) of at least approximately 1:10, wherein $T_f$ is the averaged thickness of the resist layer remaining in the first region, and $T_s$ is the averaged thickness of the remaining resist layer in the second region.

13. The method of claim 1, wherein removing part of the resist layer to leave a remaining portion further includes forming a second step thickness ratio ($T_s:T_t$) of at least approximately 1:2, wherein $T_s$ is the averaged thickness of the resist layer remaining in the second region, and $T_t$ is the averaged thickness of the remaining resist layer in the third region.

14. The method of claim 1, wherein removing part of the resist layer to leave a remaining portion further includes forming a third step thickness ratio ($T_f:T_t$) of at least approximately 1:20, wherein $T_f$ is the average thickness of the resist layer remaining in the first region, and $T_t$ is the average thickness of the remaining resist layer in the third region.

15. The method of claim 1, wherein directing radiation through a reticle further includes:
    directing the radiation at a first reticle including a first radiation zone having a first transmission value with respect to the radiation and a second radiation zone having a second transmission value with respect to the radiation, wherein the first transmission value is different than the second transmission value; and
    directing radiation at a second reticle underlying the first reticle, the second reticle including a third radiation zone having a third transmission value with respect to the radiation and a fourth radiation zone having a fourth transmission value with respect to the radiation, wherein the third optical transmission value is different than the fourth transmission value.

16. The method of claim 15, wherein the first transmission value and the third transmission value are substantially the same.

17. The method of claim 15, wherein the second transmission value and the fourth transmission value are different.

18. A method of forming an electronic device comprising:
    forming a resist layer overlying the substrate, wherein the resist layer has an initial thickness within a first region, a second region, and a third region, and wherein the second region lies between the first and third regions;

directing radiation through a reticle to expose the resist layer, the reticle having a substantially uniform cross-sectional thickness and different radiation zones having different transmission values with respect to each other, wherein within the first region the resist layer is exposed to a greater amount of radiation as compared to the resist layer within the second region, and substantially no radiation is received by the resist layer within the third region;

removing portions of the resist layer within the first region and the second region, wherein substantially all of the resist layer within the first region is removed, and the thickness of the resist layer within the second region is less than the initial thickness, and the thickness of the resist layer within the third region is substantially the initial thickness; and ion implanting a portion of the substrate within the first region and through a remaining portion of the resist layer within the second region to form a first implant region substantially within the first region and a second implant region substantially within the second region, wherein the first implant region is deeper than the second implant region, and wherein no significant amount of ions are implant in to the substrate within the third region.

19. The method of claim 18, wherein ion implanting further includes forming a guard band provided around a perimeter region of an electronic device configured to normally operate at a voltage greater than an adjacent electronic device.

20. A method of forming an electronic device comprising:

forming a resist layer over a substrate, wherein the resist layer has a first region, a second region, and a third region, wherein the second region lies between the first and third regions;

directing radiation through a reticle to expose the resist layer, wherein the reticle comprises different radiation zones having different transmission values with respect to each other, and wherein the first region of the resist layer is exposed to a different amount of radiation as compared to the second region of the resist layer;

removing a first portion of the resist layer to leave a first remaining portion, wherein within the first remaining portion, the first region of the resist layer is thinner than the second region of the resist layer;

ion implanting the substrate while the first remaining portion of the resist layer overlies the substrate to form a first implant region within the substrate;

removing a second portion of the resist layer to leave a second remaining portion, wherein within the second remaining portion, the second region is thinner than the third region of the resist layer; and ion implanting the substrate while the second remaining portion of the resist layer overlies the substrate to form a second implant region within the substrate, wherein the second implant region is adjacent to the first implant region and the first implant region is deeper than the second implant region.

* * * * *